US011922107B2

(12) United States Patent
Gutierrez et al.

(10) Patent No.: US 11,922,107 B2
(45) Date of Patent: Mar. 5, 2024

(54) QUANTUM CIRCUIT MAPPING FOR MULTI-PROGRAMMED QUANTUM COMPUTERS

(71) Applicant: Advanced Micro Devices, Inc., Santa Clara, CA (US)

(72) Inventors: Anthony T. Gutierrez, Bellevue, WA (US); Salonik Resch, Minneapolis, MN (US); Yasuko Eckert, Bellevue, WA (US); Gabriel H. Loh, Bellevue, WA (US); Mark Henry Oskin, Clinton, WA (US); Vedula Venkata Srikant Bharadwaj, Bellevue, WA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 83 days.

(21) Appl. No.: 17/490,789

(22) Filed: Sep. 30, 2021

(65) Prior Publication Data

US 2023/0102347 A1 Mar. 30, 2023

(51) Int. Cl.
G06N 10/00 (2022.01)
G06F 30/347 (2020.01)

(52) U.S. Cl.
CPC .......... *G06F 30/347* (2020.01); *G06N 10/00* (2019.01)

(58) Field of Classification Search
CPC .............................. G06F 30/347; G06N 10/00
See application file for complete search history.

(56) References Cited

U.S. PATENT DOCUMENTS

| 10,706,365 | B2 * | 7/2020 | Nation | G06F 30/30 |
| 2020/0125985 | A1 * | 4/2020 | Narang | H03K 19/20 |
| 2022/0012616 | A1 * | 1/2022 | Cherek | G06N 10/00 |

OTHER PUBLICATIONS

Viamontes et al., Graph-Based Simulation of Quantum Computation in the Density Matrix Representation, Quantum Information and Computation, vol. 5, No. 2, 2005, pp. 113-130 (Year: 2005).*

\* cited by examiner

*Primary Examiner* — Nghia M Doan
(74) *Attorney, Agent, or Firm* — Volpe Koenig

(57) ABSTRACT

Systems and methods are disclosed that map quantum circuits to physical qubits of a quantum computer. Techniques are disclosed to generate a graph that characterizes the physical qubits of the quantum computer and to compute the resource requirements of each circuit of the quantum circuits. For each circuit, the graph is searched for a subgraph that matches the resource requirements of the circuit, based on a density matrix. Physical qubits, defined by the matching subgraph, are then allocated to the logical qubits of the circuit.

20 Claims, 8 Drawing Sheets

QUANTUM COMPUTER 210

200

QUANTUM COMPUTER 210

400

500

6-QUBIT GRAPH 510

FIRST SUBGRAPH 520

SECOND SUBGRAPH 530

700

FIRST MAPPING 710

SECOND MAPPING 750

800 FIRST MAPPING 810

SECOND MAPPING 850

QUANTUM CIRCUIT MAPPING FOR MULTI-PROGRAMMED QUANTUM COMPUTERS

BACKGROUND

A quantum program specifies operations on logical qubits. To execute a quantum algorithm on physical qubits of a quantum computer, logical qubits used by the quantum algorithm need to be mapped to physical qubits. Due to process variation and high sensitivity to noise of current qubit technology, it is imperative that mapping techniques increase the probability that a quantum program, running on a quantum computer, will produce a correct output distribution. Additionally, to increase the utilization of a quantum computer, the mapping of multiple programs is beneficial. The mapping of multiple quantum programs is complicated by the need to dynamically update mapping schemes, since the topology of available physical qubits changes as quantum programs are mapped to physical qubits. Techniques for multiple program mapping are needed that improve each quantum program's efficiency and reliability and that account for fairness in allocation of physical qubits among quantum algorithms.

BRIEF DESCRIPTION OF THE DRAWINGS

A more detailed understanding can be achieved through the following description given by way of example in conjunction with the accompanying drawings wherein.

DETAILED DESCRIPTION

Figure 1:
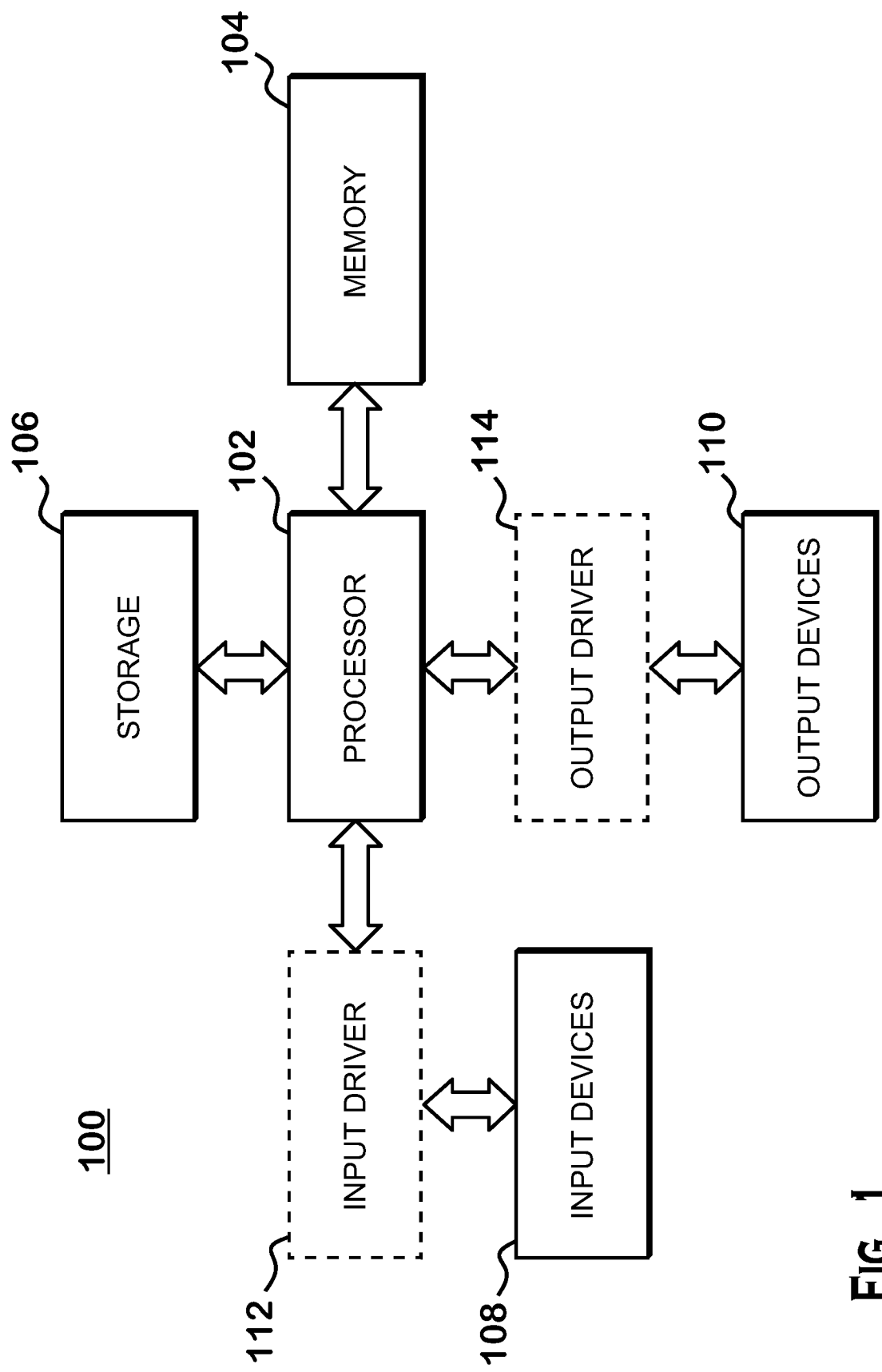
FIG. 1 is a block diagram of an example device in which one or more features of the disclosure can be implemented.

The present disclosure describes systems and methods for mapping logical qubits of quantum programs to physical qubits of a quantum computer. Mapping schemes that allocate physical qubits to logical qubits of quantum programs, disclosed herein, improve each quantum program's execution efficiency and reliability as well as improve fairness in allocation of the physical qubits among the programs.

A method for mapping quantum circuits to physical qubits of a quantum computer is disclosed. The method generates a graph that characterizes the physical qubits of the quantum computer and computes the resource requirements of each circuit of the quantum circuits. For each circuit, the method searches the graph for a subgraph that matches the resource requirements of the circuit, wherein the searching is based on a density matrix, and, then, the method allocates physical qubits, defined by the matching subgraph, to logical qubits of the circuit. After the allocation and before conducting the next search, the method updates the density matrix to account for the allocated physical qubits.

In an alternative, the search for a subgraph employs a Floyd-Warshall algorithm that operates based on the density matrix. The density matrix can contain elements, each corresponding to two physical qubits and measuring a property of connectivity between the two physical qubits and/or a property of the two physical qubits themselves. Further, the search for a subgraph can be based on the number of swap operations that is induced by the subgraph.

In another alternative, the search for a subgraph is further based on a global metric. The global metric can classify the graph into regions and the search for a subgraph can be constrained to one or more of the regions. The search for a subgraph that matches the resource requirements of the circuit can be balanced against a cost, represented by the global metric. The global metric can be defined with respect to each physical qubit of the quantum computer as a function of connections available to the physical qubit, the connections' properties, and the connections' distance from the physical qubit. After the allocation and before conducting the next search, the method updates the global metric based on the remaining physical qubits.

In yet another alternative, the search for a subgraph can be further based on a proximity metric that measures a distance of a physical qubit to other physical qubits that were already allocated to logical qubits of other circuits of the quantum circuits. The search for a subgraph can be further based on a quality metric that measures noise characteristics of the physical qubits of the quantum computer. The search for a subgraph can be further constrained to avoid degrading the connectivity of unallocated physical qubits of the quantum computer.

A system for mapping quantum circuits to physical qubits of a quantum computer is disclosed. The system comprises at least one processor and memory storing instructions that, when executed by the at least one processor, cause the system to generate a graph that characterizes the physical qubits of the quantum computer and compute resource requirements of each circuit of the quantum circuits. For each circuit, the system searches the graph for a subgraph that matches the resource requirements of the circuit, wherein the search is based on a density matrix, and, then, the system allocates physical qubits, defined by the matching subgraph, to logical qubits of the circuit.

A non-transitory computer-readable medium comprising instructions executable by at least one processor to perform a method for mapping quantum circuits to physical qubits of a quantum computer is disclosed. The method comprises generating a graph that characterizes the physical qubits of the quantum computer and computing resource requirements of each circuit of the quantum circuits. For each circuit, the method searches the graph for a subgraph that matches the resource requirements of the circuit, wherein the searching is based on a density matrix, and, then, the method allocates physical qubits, defined by the matching subgraph, to logical qubits of the circuit.

FIG. 1 is a block diagram of an example device 100 in which one or more features of the disclosure can be implemented. The device 100 can include, for example, a computer, a gaming device, a handheld device, a set-top box, a television, a mobile phone, a server, a tablet computer, or other types of computing devices. The device 100 includes a processor 102, a memory 104, a storage 106, one or more input devices 108, and one or more output devices 110. The device 100 can also optionally include an input driver 112 and an output driver 114. It is understood that the device 100 can include additional components not shown in FIG. 1.

In various alternatives, the processor 102 includes a central processing unit (CPU), a graphics processing unit (GPU), a CPU and GPU located on the same die, or one or more processor cores, wherein each processor core can be a CPU or a GPU. In various alternatives, the memory 104 is located on the same die as the processor 102 or is located separately from the processor 102. The memory 104 includes a volatile or non-volatile memory, for example, random access memory (RAM), dynamic RAM, or a cache.

The storage 106 includes a fixed or removable storage, for example, a hard disk drive, a solid-state drive, an optical disk, or a flash drive. The input devices 108 include, without limitation, a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 include, without limitation, a display, a speaker, a printer, a haptic feedback device, one or more lights, an antenna, or a network connection (e.g., a wireless local area network card for transmission and/or reception of wireless IEEE 802 signals).

The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. It is noted that the input driver 112 and the output driver 114 are optional components, and that the device 100 will operate in the same manner if the input driver 112 and the output driver 114 are not present.

Figure 2:
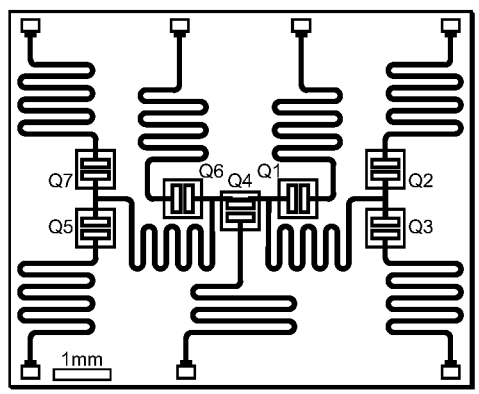
FIG. 2 is a functional block diagram of an example system for mapping logical qubits of quantum programs to physical qubits of a quantum computer, employable by the device of FIG. 1, based on which one or more features of the disclosure can be implemented.
Figure 2:
Figure 2:
Figure 2:
Figure 2:
Figure 2:
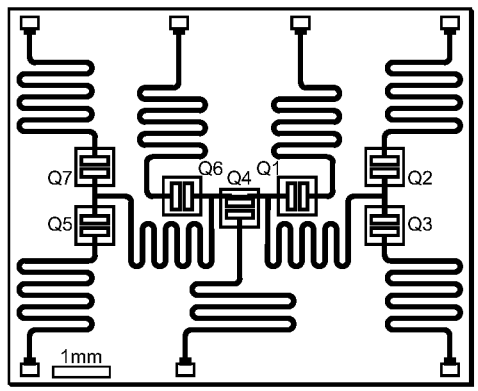

FIG. 2 is a functional block diagram of an example system 200 for mapping logical qubits of quantum programs to physical qubits of a quantum computer 210, employable by the device of FIG. 1, based on which one or more features of the disclosure can be implemented. The system 200 can include a quantum computer profiler 220, a quantum program profiler 230, a search engine 240, and a scheduler 250. In various examples, each of the elements found in system 200 can be implemented as hard-wired circuitry, software executing on a processor, or a combination of hard-wired circuitry and software.

The quantum computer profiler 220 can characterize the physical qubits of the quantum computer 210, for example, providing their topology and properties (e.g., noise characteristics). The quantum program profiler 230 can characterize the manner in which logical qubits are used by a quantum program and can derive the resource requirements of the quantum program therefrom. Typically, a quantum algorithm is represented by a circuit, and information with respect to the algorithm's resource requirements can be derived from its circuit representation. Thus, characteristics of physical qubits, output by the quantum computer profiler 220, and resource requirements of quantum programs, output by the quantum program profiler 230, are provided to the search engine 240. Based on the characteristics of physical qubits and the resource requirements of quantum programs, the search engine 240 can apply techniques disclosed herein to map logical qubits of respective quantum programs to physical qubits of the quantum computer 210 (or equivalently, to allocate physical qubits to logical qubits of respective quantum programs). The mapping results, as determined by the search engine 240, can be provided to the scheduler 250. The scheduler 250 can perform the actual mapping, i.e., the quantum algorithms' inputs to logical qubits will be fed to the inputs of their allocated physical qubits.

To increase the utilization of a quantum computer, multiple quantum programs can be run concurrently. To accomplish these simultaneous executions, allocation of physical qubits to quantum programs has to be done, taking under consideration the different resource requirements of each program. For example, each quantum program can have a different tolerance to noise, require a certain number of qubits and a certain number of connections between these qubits. Hence, the allocation of physical qubits to logical qubits used by each program has to satisfy each program's requirements. The mapping of multiple programs is further complicated by the fact that the effective topology of the physical qubits (as represented by a graph) changes as physical qubits are allocated to each program.

Figure 3:
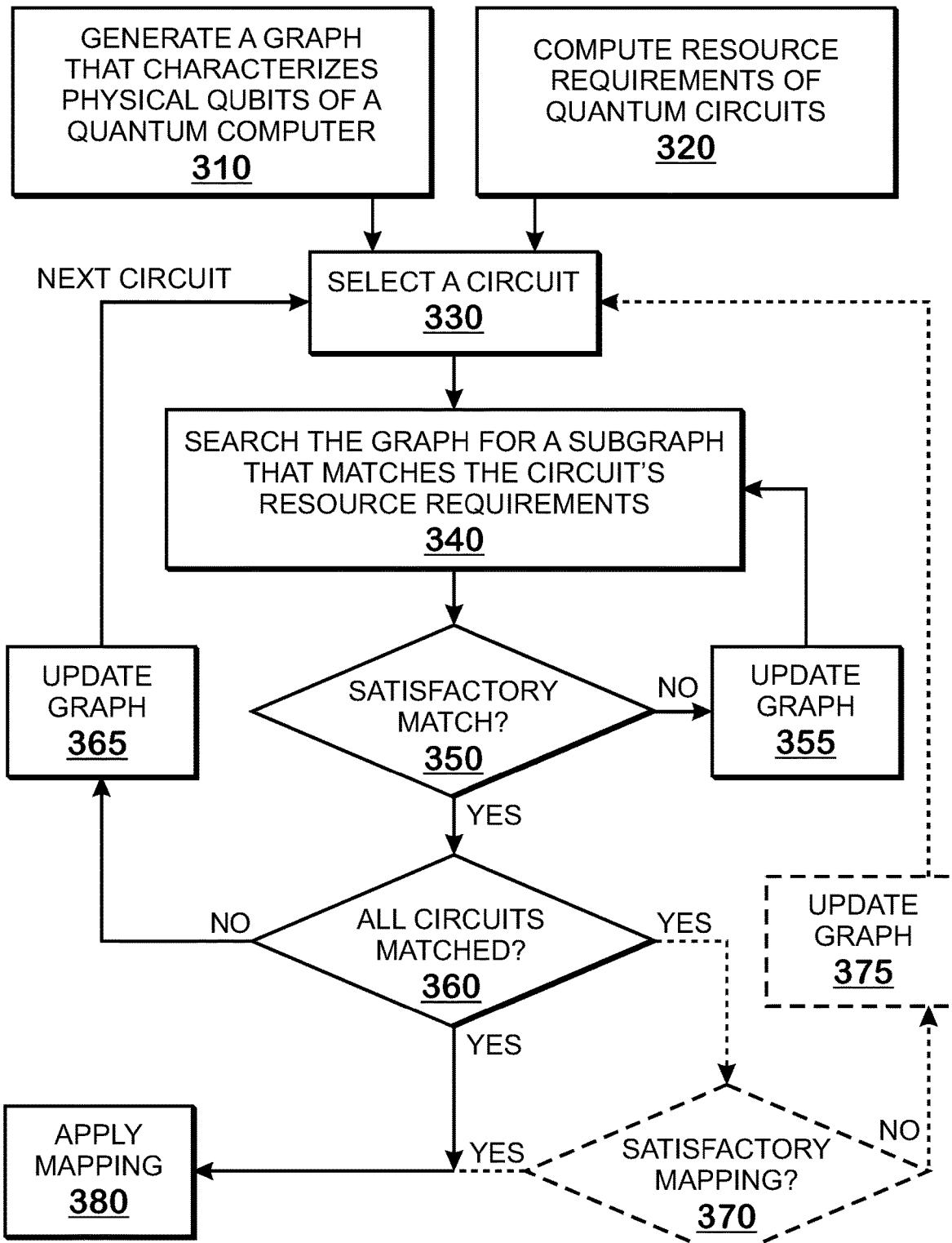
FIG. 3 is a flow diagram of an example method for mapping logical qubits of quantum programs to physical qubits of a quantum computer, based on which one or more features of the disclosure can be implemented.

FIG. 3 is a flow diagram of an example method 300 for mapping of logical qubits of quantum programs to physical qubits of a quantum computer, based on which one or more features of the disclosure can be implemented. In an alternative, step 310 can be performed by the quantum computer profiler 220, step 320 can be performed by the quantum program profiler 230, steps 330-375 can be performed by the search engine 240, and step 380 can be performed by the scheduler 250. The method 300, in step 310, generates a graph that represents characteristics of the physical qubits of the quantum computer. For example, each of the graph's nodes can represent a physical qubit and the graph's edges can each represent connectivity between nodes connected by the edge. The method 300, in step 320, computes the resource requirements of quantum programs. For example, the resource requirements of a program can be derived from its circuit representation, including requirements such as number of qubits, their connectivity, and noise tolerance. The method 300, then, proceeds with searching for physical qubits to be allocated to each program (a circuit).

Hence, a circuit is selected out of the circuits for which physical qubits are to be allocated, in step 330. Then, in step 340, the graph of physical qubits can be searched to find a subgraph with a topology and properties that match the resource requirements of the selected circuit 340. If the found match is satisfactory 350 and not all circuits already matched with a subgraph in the graph 360, the method 300, first, can update the graph 365, excluding that part of the graph (i.e., subgraph) that was already matched in step 340 to the selected circuit, and, then, the method 300 can turn to select the next circuit 330 to be matched. If the found match is not satisfactory 350, the method 300 updates the graph 355 to add more constraints to the search of a sub-graph and repeats the search 340. Steps 340, 350, and 355 can be applied repeatedly until a satisfactory match is found for a selected circuit.

Optionally, after all circuits have been matched 360, subgraphs that were matched with respective circuits can be evaluated again 370, and if the found matches are not satisfactory, the graph can be updated 375, setting new constraints so a new search iteration 330-365 for all the circuits can be initiated. If all circuits were matched to subgraphs, in step 360, and/or the found matches are satisfactory, in step 370, the method 300 can conclude, in step 380, by using the matched subgraphs to map logical qubits of respective circuits to physical qubits 380.

Figure 4:
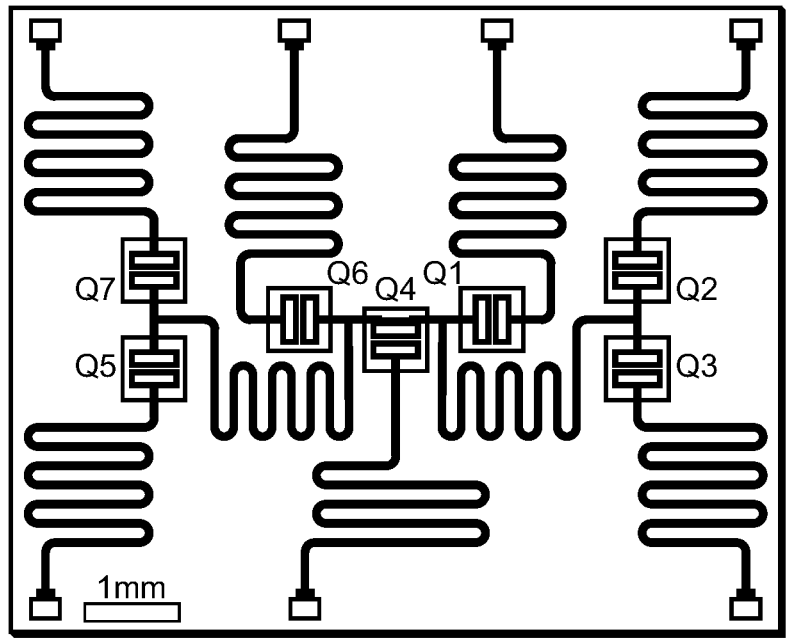
FIG. 4 is a diagram that demonstrates physical qubits of a quantum computer, represented by a 7-qubit graph, based on which one or more features of the disclosure can be implemented.
Figure 4:
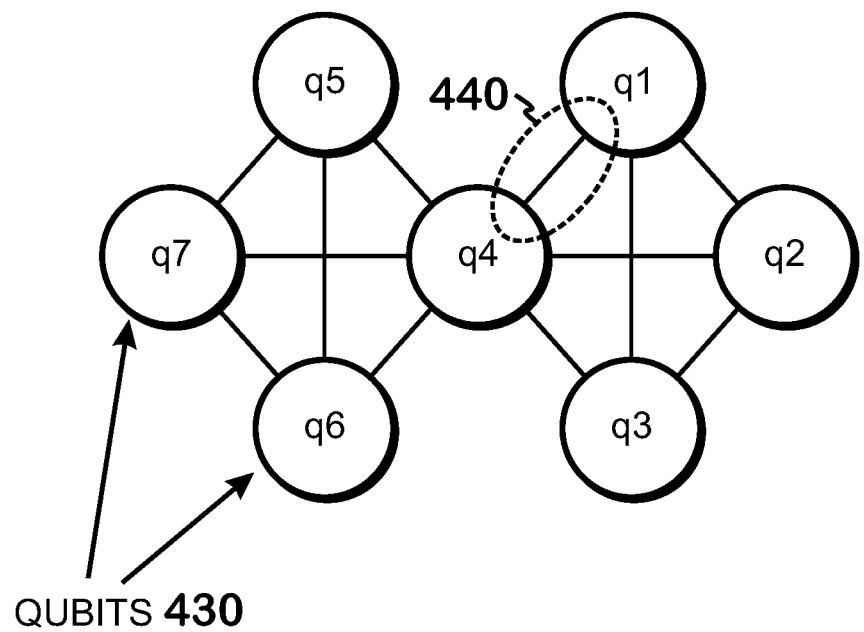

FIG. 4 is a diagram that demonstrates physical qubits of a quantum computer 410, represented by a 7-qubit graph 420 of qubits 430, based on which one or more features of the disclosure can be implemented. It should be understood that any number of qubits in a graph can be generated and that the 7-qubit graph shown in FIG. 4 is an example. The 7-qubit graph 420 can be generated 310 by the quantum computer profiler 220 of FIG. 2. Such a graph can represent the physical qubits themselves, by the graph's nodes, and the physical qubits' topology, by the graph's edges. A graph, representative of a quantum computer, can also have properties associated with it. For example, properties associated with a node can stand for properties of respective physical qubit (e.g., noise characteristics) while properties associated with an edge can stand for properties of the connection (e.g., reliability of the connection). As characteristics of the physical qubits can change with time, the quantum computer's profile has to be updated periodically, i.e., the graph and its associated properties have to be updated accordingly. A graph can also have metrics and control variables associated with it; the metrics and control variables can be used to constrain the search 340 for subgraphs within the graph, as is explained in detail below.

In an alternative, the graph 420 can be represented by a type of adjacency matrix, namely a density matrix. The density matrix can be used by the mapping method 300 of FIG. 3 to carry out searches of subgraphs within the graph. Typically, a density matrix, D, is of N by N dimension, where N is the number of physical qubits in the quantum computer. For example, in FIG. 4, the 7-qubit graph 420 can be represented by a 7×7 density matrix. An element value of this matrix, $D(i,j)$, corresponds to the $i_{th}$ qubit (node) and the $j_{th}$ qubit (node). A zero value of an element in the density matrix, $D(i,j)=0$, indicates that the $i_{th}$ qubit (node) and the $j_{th}$ qubit (node) are not directly connected. For example, as $q_2$ and $q_7$ are not directly connected, $D(2,7)=0$ and $D(7,2)=0$. A non-zero value of an element in the density matrix, $D(i,j)=d$, indicates that the $i_{th}$ qubit (node) and the $j_{th}$ qubit (node) are directly connected, wherein the value d can represent a property associated with the connection and/or the connected nodes. For example, d can measure a property of connectivity between the two qubits (nodes) and/or a property of the two qubits (nodes) themselves. For example, as $q_1$ and $q_4$ are directly connected 440, $D(1,4)=d$ and $D(4,1)=d$, where d can measure a property associated with $q_1$, $q_4$, (such as noise characteristics) and/or a property associated with the connection between $q_1$ and $q_4$ (such as the strength or stability of the connection). Once a density matrix is generated with respect to a graph 420, in an alternative, a Floyd-Warshall algorithm can be used to search for a subgraph with properties that match the resource requirements of a given circuit. The density matrix can also be used in combination with heuristics (e.g., metrics and control variables) to find approximate solutions.

A search algorithm can grow in cubic complexity with the number of physical qubits. While manageable for small quantum computers, it may be impractical to apply to larger quantum computers. Techniques disclosed herein for mapping logical qubits to physical qubits, as described with reference to FIG. 3, can be implemented on a classical processing unit, such as a CPU or a GPU of the processor 102 of FIG. 1. Processors capable of data-parallel processing, such as GPUs, can be used to accelerate a density matrix generation and a subgraph search. Techniques disclosed herein can also be implemented by an Application Specific Integrated Circuit (ASIC) that can use highly targeted hardware to increase efficiency.

As described above, the method 300 can generate a graph that characterizes the physical qubits of the quantum computer 310. The graph's topology and properties can be analyzed 340 to find a subgraph that matches the resource requirements of the quantum program to be mapped (selected circuit 330). Each quantum program can have different resource requirements as each program can have different tolerance to noise. For example, each quantum program can require a certain number of qubits and a certain number of connections between these qubits. When the method 300 searches for a matching subgraph within the graph 420 of the quantum computer 410, the matched subgraph can then be evaluated 350, 370 against the resource requirements of the circuit. This evaluation, if successful, can result in a mapping (as specified by the subgraph) that is optimal with respect to that circuit's resource requirements, i.e., a mapping that benefits that circuit.

A resource requirement of a quantum program (or quantum algorithm) can be a requirement for high connectivity among its logical qubits. Such an algorithm, when applied to highly connected physical qubits, can perform more efficiently, e.g., the number of operations that are required to complete the program can be lower. Applying greedy strategies when mapping programs can result in suboptimal mappings. That is, if all highly connected regions of the quantum computer are already allocated to programs, then the connectivity requirement of a following program to be mapped will not be fully satisfied, and, therefore, the reliability of such a program will be adversely affected. On the other hand, if a quantum program does not require high connectivity among its logical qubits, it can be mapped to sparsely connected regions of the quantum computer without degradation in performance, leaving highly connected regions available for other programs that require them. Sparsely connected regions of the quantum computer can also endure reduced crosstalk noise, which can improve reliability. Hence, a proper mapping scheme should be conservative in its allocation of highly connected regions and map sparely connected regions to programs that do not require high connectivity.

Figure 5:
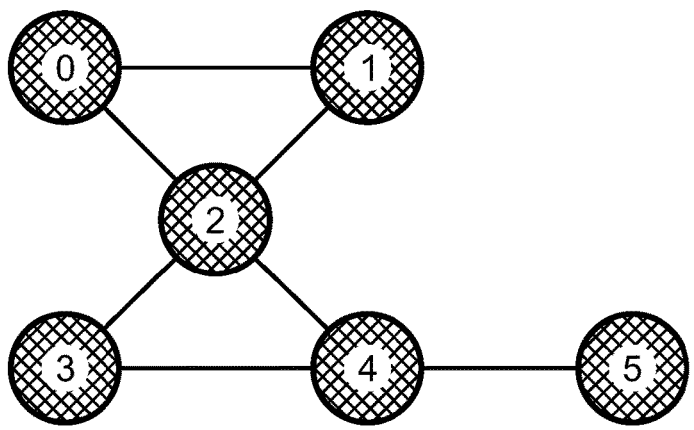
FIG. 5 is a diagram that demonstrates a 6-qubit graph of a quantum computer, containing two 3-qubits subgraphs, based on which one or more features of the disclosure can be implemented.
Figure 5:
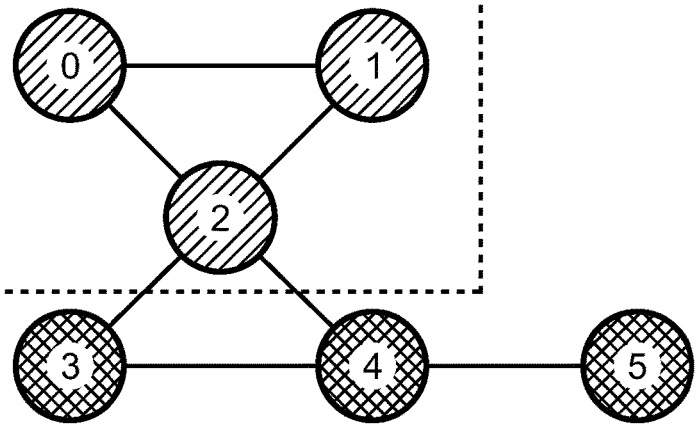
Figure 5:
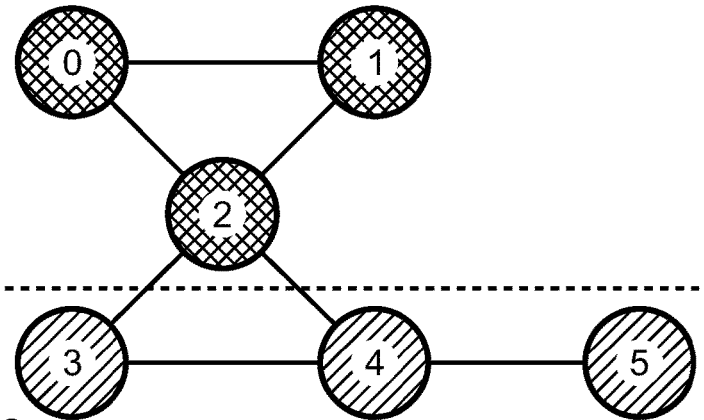

FIG. 5 is a diagram 500 that demonstrates a 6-qubit graph of a quantum computer, containing two 3-qubits subgraphs, based on which one or more features of the disclosure can be implemented. For example, the diagram 500 shows a 6-qubit graph 510 of a quantum computer. Given a quantum program that requires 3 logical qubits, two possible mappings 520, 530, of that program's logical qubits to the graph are shown 500. The first mapping 520 is preferable for a case in which the program requires high connectivity, i.e., each qubit can interact with each other with high frequency. This first mapping 520, if applied, can eliminate the need to perform swap operations. The second mapping 530 is preferable for a case in which the program requires only nearest-neighbor connections. This second mapping 530, if applied, is likely to be less susceptible to crosstalk noise and leaves highly connected qubits unallocated, making them available for other programs that require them.

Generally, swap operations can occur during the operation of a quantum algorithm if the connectivity that the algorithm relies on is not provided by the physical qubits. In such a case, swapping of the mapping between allocated physical qubits and corresponding logical qubits is required. A swap operation consumes execution time, and, therefore, the number of times it occurs should be minimized by, for example, satisfying as much as possible the connectivity requirements of a program. For example, when searching 340 the graph for a subgraph that matches the circuit's resource requirements, a constraint can be enforced that minimizes the number of swap operations that are ensued by a subgraph.

When searching the graph for a subgraph that satisfies the resource requirements of a program (as represented by its circuit), the search benefits that program. Hence, techniques disclosed herein also consider the cost of mapping. Accordingly, the benefit of a mapping to a program can be balanced against the cost of that mapping. To that end, the search 340 can be further constrained based on a global metric. For example, the Floyd-Warshall algorithm can be used to search for a subgraph 340 based on the density matrix as well as a global metric. The global metric can be defined relative to the graph, thereby, it can classify the graph (or the quantum computer associated with it) into regions, e.g., with various levels of reliability and connectivity. Then, a search can be constrained to one or more regions of the graph based on this classification. A global metric can be defined with respect to each physical qubit of the quantum computer. For example, a global metric with respect to a physical qubit can be defined as a function of the qubit's connections, their properties, and the distance of each connection from the physical qubit.

Figure 6:
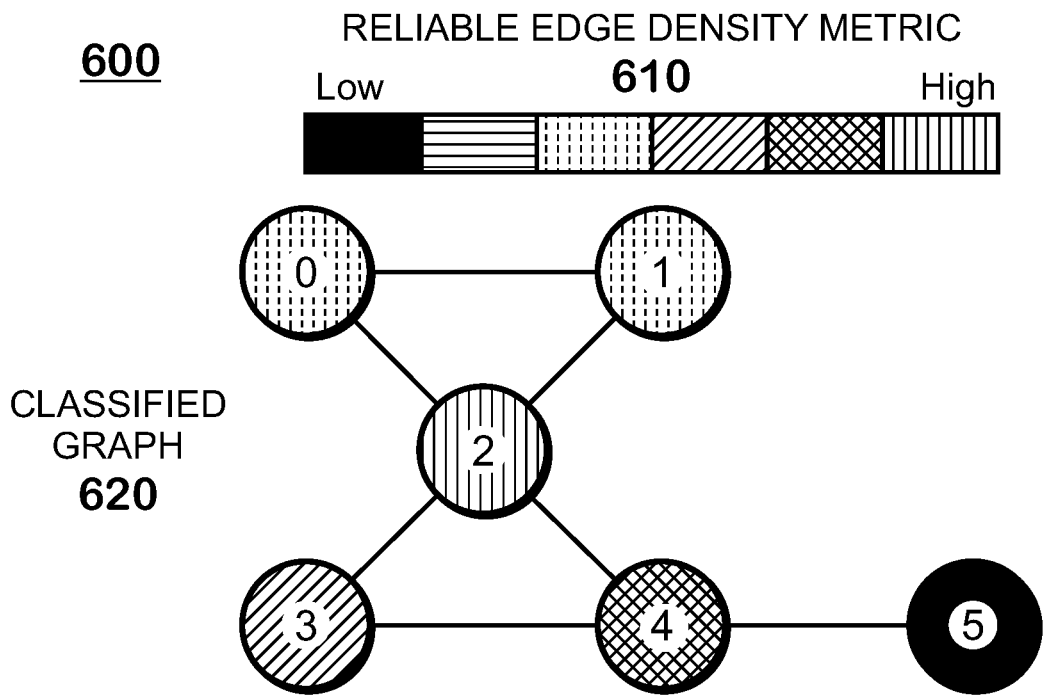
FIG. 6 is a diagram that demonstrates example global metrics, based on which one or more features of the disclosure can be implemented.

FIG. 6 is a diagram that demonstrates example global metrics, based on which one or more features of the disclosure can be implemented. A global metric can be indicative of a cost of mapping. For example, a global metric, denoted as a reliable edge density metric can be defined for each node (physical qubit) of the graph as a function of connections available to the node, the connections' quality, and the connections' distance from the node. The reliable edge density metric measures the desirability of every physical qubit to be mapped to a quantum program that requires highly connected qubits. In FIG. 6, a graph 620, classified based on a reliable edge density metric 610, is shown, where nodes with high connectivity and high quality have a high metric value. For example, node 2 has the highest metric value, and thus node 2 is considered as the most desirable physical qubit. This metric not only measures the desirability of each qubit, but also the cost of allocating it (e.g., the cost of not having it available for other programs). Thus, the edge reliability density metric considers global effects when searching for a subgraph for a program to be mapped.

A global metric can be used to search for subgraphs locally in the graph. For example, the reliable edge density metric can be used to search locally for subgraphs of highly connected and reliable qubits of a specified size. By considering both the global metric and the local subgraphs (i.e. how well they match the resource requirements of the program to be mapped), optimal mappings of programs of different sizes can be achieved. The searching operation 340 can simultaneously maximize the subgraph's reliability and connectivity (to benefit the program whose resource requirements are being satisfied by the matching subgraph), while minimizing the impact on the global reliable edge density metric (i.e., a cost that can represent how the choice of a certain subgraph to be allocated to the program being mapped can affect the mapping of other programs). The degree to which the benefit to a program being mapped is maximized and the degree in which the cost is minimized when searching for a matching subgraph for a program 340 can be determined by a global metric of a benefit-to-cost ratio metric.

In FIG. 6, a graph 660 is classified based on a benefit-to-cost ratio metric 650. For example, when searching for a 2-qubit subgraph for a program that requires two connected qubits of high quality, the searching operation 340 can be based on the benefit-to-cost ratio metric 650. In this case, as demonstrated in FIG. 6, the better subgraphs to be allocated to the program are those that provide sufficient 2-qubit connectivity (e.g., node 0 and node 1) while not consuming precious highly connected regions (e.g., node 2).

In an alternative, matching subgraphs, i.e., subgraphs that were found by the searching operation 340 as described in reference to FIG. 3, can be evaluated 350, 370, based on heuristics. Based on the evaluation, if a matching subgraph is not satisfactory, then search constrains can be introduced 355, 375, and a search 340 for another subgraph can be carried out. Heuristics, for example, can be based on a requirement for proximity between subgraphs, a requirement for quality of qubits in the subgraph (for noise sensitive quantum programs), or a topology requirement, as described in detail below.

Figure 7:
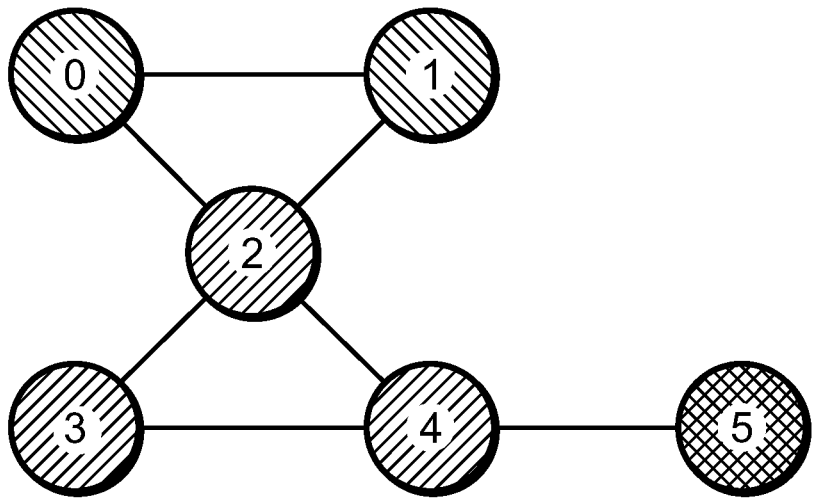
FIG. 7 is a diagram that demonstrates an example proximity metric, based on which one or more features of the disclosure can be implemented.
Figure 7:
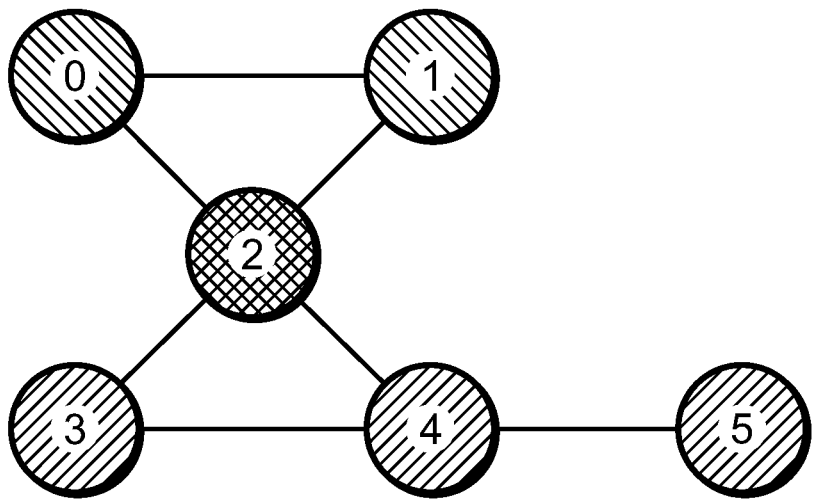

FIG. 7 is a diagram that demonstrates an example proximity metric, based on which one or more features of the disclosure can be implemented. Multiple programs running on the same quantum computer, preferably, should be using physical qubits that are far apart (i.e., their respective subgraphs should be located away from each other in the graph). Otherwise, crosstalk noise between qubits mapped to different programs can degrade the reliability of the respective quantum algorithms. For example, consider a case in which a first program with a resource requirement of 2 qubits and a second program with a resource requirement of 3 qubits are to be mapped to a 6-qubit quantum computer, represented by the graphs of FIG. 7. Two possible mappings are shown in FIG. 7. Again, as mentioned above with other Figures, it should be understood that an example is provided and that the techniques disclosed herein can be applied to a quantum computer having any a plurality of qubits.

In the first mapping 710, the first program is mapped to qubits 0 and 1 and the second program is mapped to qubits 2, 3, and 4. In the second mapping 750, the first program is mapped to nodes 0 and 1 and the second program is mapped to nodes 3, 4, and 5. If neither program requires high connectivity, the second mapping 750 is preferable. This is because the programs do not have any neighboring qubits in the second mapping 750. Because the programs do not have neighboring qubits, there will be less interference.

Hence, the searching operation 340 can be constrained to favor qubits that are further from other allocated qubits, while still accounting for reliability and connectivity. Constraining the search in this manner can be done based on a proximity metric, computed for each qubit (node) of the graph. Such a proximity metric measures, for example, the distance of the node to other nodes of subgraphs that were already matched with programs. A proximity control variable can be set to control the degree to which the searching operation 340 is constrained by the proximity metric. A proximity metric in effect increases the cost of qubits near other qubits that were already allocated to programs, and, hence, decreases their likelihood to be chosen. If avoiding proximity is considered more important (i.e., high proximity control variable), the searching operation 340 can end up matching the program with qubits farther away from qubits already matched with another program even though they may be less reliable and more sparsely connected.

The searching operation can also be constrained based a program's sensitivity to noise. Different quantum algorithms have varying resilience to noise. Thus, programs that are more sensitive to noise, preferably, should be mapped to more reliable qubits. Otherwise, not reliable qubits mapped to an algorithm that is not resilient to noise will fail to produce acceptable results. By contrast, some algorithms are specifically designed to tolerate noise and thus can better tolerate noisy qubits. The programs of such algorithms could run with negligible degradation of performance when using noisy qubits. Hence, mapping these programs to the highest quality qubits could be wasteful. Taking under consideration programs' sensitivity to noise can be achieved by a quality metric. A quality control variable can be set to control the degree to which the searching operation 340 is constrained by the quality metric. A quality metric in effect increases the cost of qubits of low quality (noisy qubits), and hence decrease their likelihood to be chosen. Thus, the quality control variable can be set relatively high when mapping programs that are noise sensitive, making only the most reliable regions acceptable. In an alternative, qubits that are highly noisy should be entirely avoided or be mapped to separate quantum programs.

Figure 8:
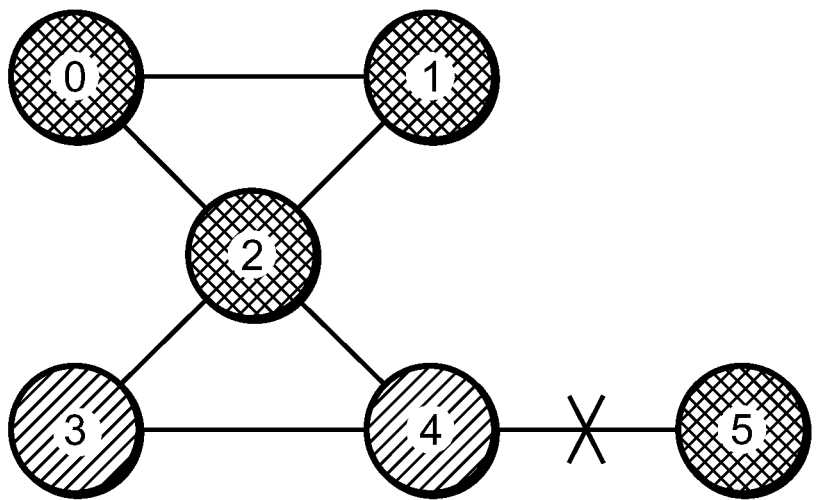
FIG. 8 is a diagram that demonstrates an example for topology-aware mapping, based on which one or more features of the disclosure can be implemented.
Figure 8:
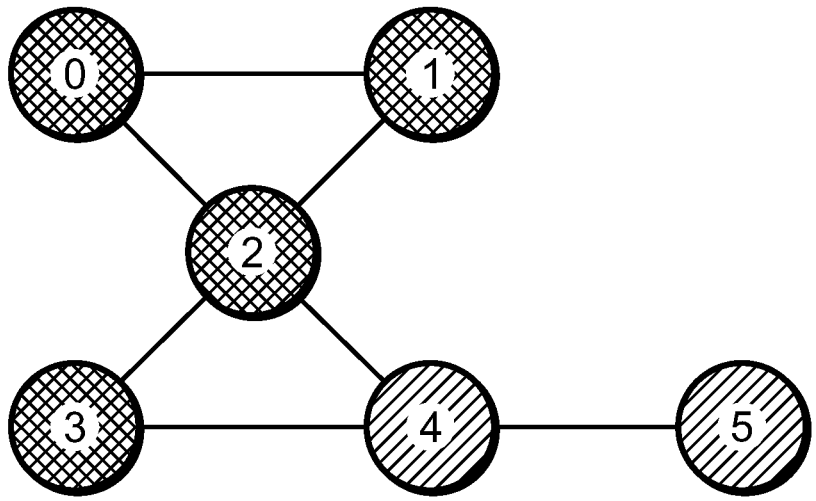

FIG. 8 is a diagram that demonstrates an example for topology-aware mapping, based on which one or more features of the disclosure can be implemented. Allocations of physical qubits should avoid degrading the connectivity of the remaining physical qubits in the graph as much as possible. Since, if a quantum program does not use a collection of qubits, yet cuts off their path to other available qubits, this will limit further possible mappings. Fragmenting the graph topology in that manner can be particularly destructive if the isolated collection of qubits is insufficient to run any other program that needs to be mapped. To avoid degrading connectivity, the impact of an allocation can be evaluated 350, 370 and, if necessary, a new search can be carried out that is constrained to maintain connectivity.

FIG. 8 shows a 6-qubit graph. As mentioned before, such a graph can represent the physical qubits themselves, by the graph's nodes, and the physical qubits' topology, by the graph's edges. Two possible mappings, 810 and 850, to the logical qubits of a quantum program are shown in FIG. 8. For example, in a first mapping 810 a program is mapped to qubits (nodes) 3 and 4. This mapping eliminates all connections to qubit (node) 5. This is undesirable because, at most, three connected qubits (0, 1, and 2) can be used for the mapping of another program, while four qubits (0, 1, 2, and 5) remain unallocated. This situation prevents a full utilization of the physical qubits available in the quantum computer.

Alternatively, in a second mapping 850 the program is mapped to qubits (nodes) 4 and 5. This mapping is a better choice as all four remaining qubits (0, 1, 2, and 3) can be used for the mapping of another program. To avoid degrading the connectivity of the unallocated qubits in the graph, after matching a subgraph to a program in step 340, the connectivity of the remaining nodes can be examined 350, 370. For example, the connectivity of the remaining nodes can be examined based on a density matrix. If the remaining qubits show a significant reduction in connectivity, the search can be constrained to avoid the matched subgraph 355, 375, and, then, the search can be repeated under this constraint 340.

It should be understood that many variations are possible based on the disclosure herein. Although features and elements are described above in particular combinations, each feature or element can be used alone without the other features and elements or in various combinations with or without other features and elements.

The various functional units illustrated in the figures and/or described herein (including, but not limited to, the processor 102, the input driver 112, the input devices 108, the output driver 114, the output devices 110) may be implemented as a general purpose computer, a processor, or a processor core, or as a program, software, or firmware, stored in a non-transitory computer readable medium or in another medium, executable by a general purpose computer, a processor, or a processor core. The methods provided can be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such instructions capable of being stored on a computer readable media). The results of such processing can be maskworks that are then used in a semiconductor manufacturing process to manufacture a processor which implements features of the disclosure.

The methods or flow charts provided herein can be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A method for mapping quantum circuits to physical qubits of a quantum computer, comprising:
   generating a graph that characterizes the physical qubits of the quantum computer;
   computing resource requirements of each circuit of the quantum circuits; and
   for each circuit:
      searching the graph for a subgraph, based on a density matrix and a global metric, that matches the resource requirements of the circuit, and
      allocating physical qubits, defined by the matching subgraph, to logical qubits of the circuit.

2. The method of claim 1, further comprising:
   updating the density matrix to account for the allocated physical qubits.

3. The method of claim 1, wherein an element of the density matrix corresponds to two physical qubits and measures any one or a combination of a property of connectivity between the two physical qubits and a property of a qubit of the two physical qubits.

4. The method of claim 1, wherein the searching employs a Floyd-Warshall algorithm that operates based on the density matrix.

5. The method of claim 1, wherein the searching is further based on a number of swap operations, induced by the subgraph.

6. The method of claim 1, wherein the global metric classifies the graph into regions and wherein the searching is constrained to one or more of the regions.

7. The method of claim 1, further comprising:
updating the global metric based on remaining physical qubits after the allocation.

8. The method of claim 1, wherein the searching of the graph for a subgraph that matches the resource requirements of the circuit is balanced against a cost, represented by the global metric.

9. The method of claim 1, wherein the global metric is defined with respect to each physical qubit of the quantum computer as a function of connections available to the physical qubit, properties of the connections, and a distance of the connections from the physical qubit.

10. The method of claim 1, wherein the searching is further based on a proximity metric that measures a distance of a physical qubit to other physical qubits that were already allocated to logical qubits of other circuits of the quantum circuits.

11. The method of claim 1, wherein the searching is further based on a quality metric that measures noise characteristics of the physical qubits of the quantum computer.

12. The method of claim 1, wherein the searching is further constrained to avoid degrading connectivity of unallocated physical qubits of the quantum computer.

13. A system for mapping quantum circuits to physical qubits of a quantum computer, comprising:
at least one processor; and
memory storing instructions that, when executed by the at least one processor, cause the system to:
generate a graph that characterizes the physical qubits of the quantum computer;
compute resource requirements of each circuit of the quantum circuits; and
for each circuit:
search the graph for a subgraph, based on a density matrix and a global metric, that matches the resource requirements of the circuit, and
allocate physical qubits, defined by the matching subgraph, to logical qubits of the circuit.

14. The system of claim 13, wherein the memory storing instructions further cause the system to:
update the density matrix to account for the allocated physical qubits.

15. The system of claim 13, wherein an element of the density matrix corresponds to two physical qubits and any one or a combination of a property of connectivity between the two physical qubits and a property of a qubit of the two physical qubits.

16. The system of claim 13, wherein the global metric classifies the graph into regions and wherein the search is constrained to one or more of the regions.

17. The system of claim 13, wherein the memory storing instructions further cause the system to:
update the global metric based on remaining physical qubits after the allocation.

18. The system of claim 13, wherein the search of the graph for a subgraph that matches the resource requirements of the circuit is balanced against a cost, represented by the global metric.

19. The system of claim 13, wherein the global metric is defined with respect to each physical qubit of the quantum computer as a function of connections available to the physical qubit, properties of the connections, and a distance of the connections from the physical qubit.

20. A non-transitory computer-readable medium comprising instructions executable by at least one processor to perform a method for mapping quantum circuits to physical qubits of a quantum computer, the method comprising:
generating a graph that characterizes the physical qubits of the quantum computer;
computing resource requirements of each circuit of the quantum circuits; and
for each circuit:
searching the graph for a subgraph, based on a density matrix and a global metric, that matches the resource requirements of the circuit, and
allocating physical qubits, defined by the matching subgraph, to logical qubits of the circuit.

\* \* \* \* \*